United States Patent
Lopin et al.

(10) Patent No.: US 8,970,171 B2
(45) Date of Patent: Mar. 3, 2015

(54) BATTERY CONDITIONER WITH POWER DISSIPATER

(75) Inventors: Michael Lopin, Newton, MA (US); James G. Radzelovage, Londonderry, NH (US); Hailong Xu, Westford, MA (US); Frederick Faller, Burlington, MA (US)

(73) Assignee: Zoll Medical Corporation, Chelmsford, MA (US)

( * ) Notice: Subject to any disclaimer, the term of this patent is extended or adjusted under 35 U.S.C. 154(b) by 1035 days.

(21) Appl. No.: 12/984,951

(22) Filed: Jan. 5, 2011

(65) Prior Publication Data

US 2012/0169287 A1 Jul. 5, 2012

(51) Int. Cl.
*H02J 7/00* (2006.01)
*H02J 7/14* (2006.01)
*H01M 10/42* (2006.01)

(52) U.S. Cl.
CPC ............. *H02J 7/0057* (2013.01); *H01M 10/42* (2013.01)
USPC ............ 320/127; 320/131; 320/118; 320/119

(58) Field of Classification Search
USPC ......... 320/127, 131, 118, 134, 128, 109, 164, 320/136
See application file for complete search history.

(56) References Cited

U.S. PATENT DOCUMENTS

| | | | |
|---|---|---|---|
| 5,652,500 A * | 7/1997 | Kadouchi et al. | 320/150 |
| 5,918,469 A * | 7/1999 | Cardella | 62/3.7 |
| 6,191,554 B1 * | 2/2001 | Nakane et al. | 320/114 |
| 7,126,094 B2 | 10/2006 | Bower et al. | |
| 2006/0181244 A1 * | 8/2006 | Luo et al. | 320/128 |
| 2009/0002549 A1 * | 1/2009 | Kobayashi | 348/374 |
| 2009/0096413 A1 * | 4/2009 | Partovi et al. | 320/108 |
| 2010/0213900 A1 * | 8/2010 | Carrier et al. | 320/134 |
| 2010/0270976 A1 * | 10/2010 | Tamura | 320/136 |
| 2011/0156618 A1 * | 6/2011 | Seo et al. | 318/3 |

* cited by examiner

*Primary Examiner* — Edward Tso
*Assistant Examiner* — Alexis A Boateng
(74) *Attorney, Agent, or Firm* — Lando & Anastasi, LLP (57) ABSTRACT

The present application is directed to a power dissipation apparatus including a conductive trace formed on a substrate and to methods of using the power dissipation apparatus. The power dissipation apparatus may be used to dissipate heat generated from electrical current passed through the conductive trace of the power dissipation apparatus. The current may be provided from, for example, a battery conditioner.

29 Claims, 8 Drawing Sheets

BATTERY CONDITIONER WITH POWER DISSIPATER

BACKGROUND OF INVENTION

1. Field of Invention

The present invention is directed to systems and methods of conditioning a battery, and more specifically to systems and methods of discharging a battery and dissipating heat generated from the discharge current.

2. Discussion of Related Art

The performance of batteries of various types, for example, nickel-cadmium (NiCd), nickel metal hydride (NiHM), and lithium ion (Li-ion) may be maintained over a significant period of time by periodic conditioning. The effect of conditioning on the performance of a battery is dependent on the discharge/usage profile for the battery. In some instances the performance of a battery may be maintained or improved by periodically depleting the battery by discharging into a resistive or active load until a cutoff voltage is reached. After the battery has been depleted, it is then recharged. The energy withdrawn from the battery during the discharge cycle often generates heat.

SUMMARY OF INVENTION

In accordance with an aspect of the present invention, there is provided a battery conditioner. The battery conditioner comprises circuitry configured to withdraw current from a battery and direct the current into a power dissipation apparatus comprising a non-conductive substrate and a conductive trace formed at least one of in the substrate and on the substrate, the conductive trace having a first end coupled to the battery and a second end, wherein the conductive trace converts substantially all of the current from the battery into heat between the first end and the second end.

In some embodiments, the non-conductive substrate is formed into the shape of an open ended conduit. The battery conditioner may further comprise a fan configured to direct air through the open ended conduit formed from the non-conductive substrate. In some embodiments, the electrical resistance of the conductive trace between the first end and the second end conductive trace is variable. In some embodiments the power dissipation apparatus further comprises at least one switch, electrically connected between a first region of the conductive trace and a second region of the conductive trace and configured to create a short circuit between the first region of the conductive trace and the second region of the conductive trace. In some embodiments the battery conditioner further comprises a sense resistor, wherein the switch comprises a transistor configured to short out a section of the conductive trace that interconnects the first region and the second region responsive to to a signal from the sense resistor indicative of a current through the conductive trace being outside of a defined range. In some embodiments the conductive trace has a resistance of between about 1 ohm and about 100 ohms and in some embodiments the conductive trace has a resistance of between about 2 ohms and about 40 ohms.

In some embodiments the conductive trace is dimensioned to self-limit a temperature of the conductive trace to within ±5° Celsius of a defined temperature when a defined voltage is applied across the first end and the second end of the conductive trace.

In some embodiments the conductive trace is surrounded by an electrically insulating material.

In some embodiments the conductive trace has a non-uniform cross-sectional area along a length thereof. In some embodiments the conductive trace comprises a plurality of substantially parallel interconnected lines of conductive material each having a width and including a first subset of substantially parallel interconnected lines of conductive material and a second subset of substantially parallel interconnected lines of conductive material, the width of each of the substantially parallel interconnected lines of conductive material in the first subset being greater than the width of each of the substantially parallel interconnected lines of conductive material in the second subset.

In some embodiments the power dissipation apparatus is mounted to an external surface of the battery conditioner and is in thermal communication with the external surface of the battery conditioner.

In some embodiments the conductive trace comprises a plurality of substantially parallel interconnected lines of conductive material including a first subset of substantially parallel interconnected lines of conductive material and a second subset of substantially parallel interconnected lines of conductive material, a spacing between adjacent substantially parallel interconnected lines of conductive material in the first subset being greater than a spacing between adjacent substantially parallel interconnected lines of conductive material in the second subset. In some embodiments the battery conditioner further comprises a fan and an open ended conduit, wherein the non-conductive substrate is enclosed in the open ended to conduit and the fan is configured to direct air through the open ended conduit. In some embodiments the open ended conduit has a non-uniform cross-sectional area along a length thereof. In some embodiments, the open ended conduit includes one or more opening in a wall thereof, the one or more openings configured to provide for air flow into and out of the open ended conduit along a length thereof.

In some embodiments the non-conductive substrate is formed from epoxy impregnated fiberglass.

In some embodiments the battery conditioner further comprises a thermally conductive material enclosed within the substrate.

In some embodiments the conductive trace comprises a first conductive trace formed on a first side of the substrate, and the power dissipation apparatus further comprises a second conductive trace formed on a second side of the substrate and electrically connected to the first conductive trace.

In accordance with another aspect of the present invention, there is provided a method of conditioning a battery. The method comprises withdrawing current from the battery, directing the current through a power dissipation apparatus comprising a non-conductive substrate and a conductive trace formed at least one of in the substrate and on the substrate, and converting substantially all of the current into heat along a length of the conductive trace.

In some embodiments the method further comprises adjusting an electrical resistance of the conductive trace. In some embodiments the method further comprises maintaining a current through the conductive trace within a defined tolerance band. In some embodiments maintaining the current through the conductive trace within the defined tolerance band comprises shorting out a section of the conductive trace responsive to a signal from a sense resistor indicative of a current through the conductive trace being outside of the defined tolerance band.

In some embodiments the method further comprises maintaining a temperature of the power dissipation apparatus within a defined tolerance band. In some embodiments maintaining the temperature of the power dissipation apparatus within the defined tolerance band comprises shorting out a section of the conductive trace responsive to a temperature of the power dissipation apparatus being outside of the to defined tolerance band.

In some embodiments the method further comprises dissipating the heat. In some embodiments dissipating the heat comprises conducting heat into an external surface of a battery conditioner and in some embodiments dissipating the heat comprises directing air across the conductive trace.

In accordance with another aspect of the present invention, there is provided a battery draining device. The battery draining device comprises a printed circuit board and a metal trace formed on the printed circuit board, the metal trace configured to dissipate substantially all energy drained from the battery.

In some embodiments the metal trace has a non-uniform cross-sectional area along a length thereof. In some embodiments the metal trace comprises a plurality of substantially parallel interconnected metal lines each having a width and including a first subset of substantially parallel interconnected metal lines and a second subset of substantially parallel interconnected metal lines, the width of each of the substantially parallel interconnected metal lines in the first subset being greater than the width of each of the substantially parallel interconnected metal lines in the second subset.

In some embodiments the battery draining device further comprises at least one switch, electrically connected between a first region of the metal trace and a second region of the metal trace and configured to electrically connect and disconnect the first region of the metal trace and the second region of the metal trace. In some embodiments the battery draining device further comprises a sense resistor, and the switch comprises a transistor configured to short out a section of the metal trace that interconnects the first region and the second region responsive to a signal from the sense resistor indicative of a current through the conductive trace being outside of a defined range.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

The present disclosure is directed generally to systems and methods for conditioning batteries. The performance and life of a battery or battery pack can be improved and extended by a periodically performed conditioning process including, for example, fully discharging the battery or battery pack and then recharging it to full capacity. Further, by charging a battery or battery pack to full capacity and then discharging it while monitoring the amount of power drawn from the battery or battery pack during discharge, the storage capacity and expected run time of the battery or battery pack may be known.

In accordance with an aspect of the present disclosure, there is provided a battery conditioner configured to accept a battery pack, charge the battery pack, and to discharge the battery pack as part of a battery conditioning process. In some embodiments, the battery conditioner includes a single bay, and in other embodiments, includes two or more bays, each bay configured to accept one battery pack. Battery packs that may be conditioned in the battery conditioner may include, for example, 32 volt, 2.4 AH NiMH battery packs, although the present disclosure is not limited to any particular type of battery pack or battery packs having any particular voltage and/or capacity ratings. In some embodiments, a conditioning routine performed by the battery conditioner may include discharging the 32 volt NiMH battery pack at a rate of approximately two Amps. At this discharge rate a total of over 60 watts are produced from the discharge of the battery pack. When two 32 volt NiMH battery packs are discharged simultaneously, this power output increases to over 120 watts. The power drawn from the discharging batteries may be converted into heat. It would be desirable to remove the heat from the battery conditioner to keep the components thereof at a temperature that is consistent with long term reliability.

In accordance with an aspect of the present disclosure, a battery conditioner is provided with a resistive load comprising a substrate including one or more conductive traces. The conductive traces are in some embodiments formed of lines of a film of a metal such as copper, although in other embodiments other types of conductive materials may be utilized. In some embodiments, the substrate comprises a printed wiring board or printed circuit board comprised of, for example, epoxy impregnated fiberglass. An advantage of this type of substrate is that it is relatively inexpensive and may be provided with a conductive trace using techniques known in the art of printed circuit board manufacturing. The one or more conductive traces are to formed on a surface of the substrate, or in other embodiments, in trenches etched in the surface of the substrate. In other embodiments, the substrate comprises a flexible material which is capable of being bent into a shape of an open ended conduit, for example, a tube. The one or more conductive traces may be formed on the substrate by screen printing, physical vapor deposition, electrolytic deposition, or any other deposition method known in the art.

Figure 1:
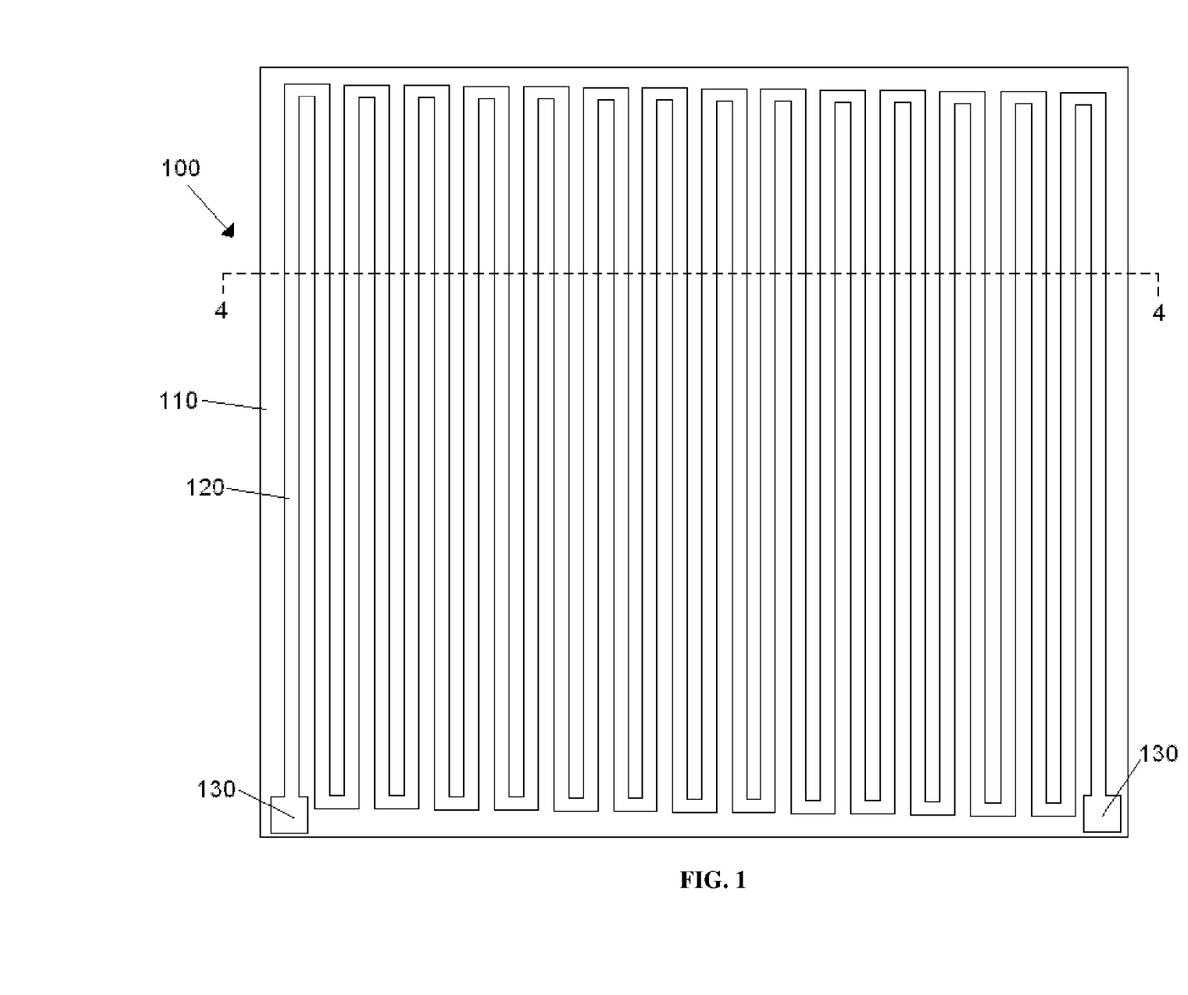
FIG. 1 is a plan view of a power dissipation apparatus according to an aspect of the present invention.

FIG. 1 illustrates a first embodiment of a power dissipation apparatus 100 according to the present invention. The power dissipation apparatus 100 includes a substrate 110 onto which is printed a conductive trace 120. The conductive trace 120 is printed on the substrate in a serpentine pattern. Although corners of the conductive trace 120 are shown a being sharp 90° corners, it should be appreciated that in other embodiments, the corners of the conductive trace may be rounded to avoid any localized heating. It should also be appreciated that other (e.g., rectilinear) configurations may be used, as conductive traces 120 of different embodiments according to the present disclosure are not limited to a serpentine configuration. The conductive trace 120 may be provided with contact pads 130 at the ends thereof to facilitate the electrical connection of the conductive trace 120 to a source of power, for example, to one or more terminals of a battery or battery pack or to power outputs of a battery conditioner or other electrical device. For example, during discharge of a battery or battery pack, the positive terminal of the battery pack or battery pack would be connected to one of the contact pads 130, and the negative terminal or ground connected to the other contact pad 130. In another example, a battery conditioner includes circuitry such as a current controller between a terminal of a battery and one of the contact pads 130. In some embodiments, in use, substantially all electrical power withdrawn from a battery is converted to heat in the conductive trace 120.

In one embodiment, a connector may be used to connect a battery or battery conditioner to the power dissipation apparatus and permit one to easily remove and/or replace the power dissipation apparatus, if necessary. One type of connector that may be used is an FFC type connector available from Molex Corporation. It should be appreciated that the embodiments of the present disclosure are not limited to any particular type of connector, as any connector that is capable of being used to to electrically connect the contact pads 130 to a source of power may be used instead.

The substrate 110 and conductive trace 120 may be dimensioned to provide a desired electrical resistance and desired surface area for a particular use. In one embodiment, the substrate 110 is substantially square with sides of approximately ten inches in length. In other embodiments the substrate 110 may be sized and shaped as desired to, for example, provide a desired surface area, or to fit within a certain enclosure or on a particular surface. In one embodiment, the power dissipation apparatus 100 includes a conductive trace 120 including about 167 interconnected ten inch long lines of one ounce copper (a copper film having a weight of one ounce per square foot—about 1.3 mil or 34 microns thick), each line having a width of about 0.05 inches, with about 0.01 inches between each line. This conductive trace 120 has an electrical resistance of about 20 ohms. It should be noted that a conductive trace 120 with this resistance value is only one possible embodiment. In some embodiments, the conductive trace 120 has a resistance in the range of from about 1 ohm to about 100 ohms, and in other embodiments, has a resistance in the range of from about 2 ohms to about 40 ohms. Conductive traces in different embodiments of the present disclosure are not limited to a particular resistance value or range of resistance values or to particular dimensions. The conductive trace 120 may be dimensioned to provide a desired resistance and surface area for a particular use, for example, to dissipate the power from a battery of a defined voltage and capacity within a desired time while producing less than a defined increase in temperature of the power dissipation apparatus.

In other embodiments, the power dissipation apparatus 100 can be provided with a conductive trace 120 on both an upper and a lower surface. In embodiments where these conductive traces have the same dimensions as that described above, and are electrically connected in parallel, the combination of the conductive traces would have an electrical resistance of about 10 ohms. In embodiments where the two conductive traces are electrically connected in series, the combined electrical resistance would be about 40 ohms.

As a first approximation, the temperature rise from room temperature of a surface with a defined amount of power (W) input into it is approximately 100 C.°/W/in$^2$. For the power dissipation apparatus 100 described above, the surface area is about 100 square inches. If the example battery conditioner described above was used to discharge a single battery pack and produce 60 W of power, and this power was directed through the conductive trace 120 of this power dissipation apparatus 100, the temperature rise of the power dissipation apparatus 100 would be about 60 C.° in still air.

To facilitate the removal of heat from the power dissipation apparatus 100, in some embodiments air is forced over the surface of the power dissipation apparatus 100 by, for example, one or more fans. Providing forced air to cool the surface of the power dissipation apparatus 100 described above can provide for sufficient convective heat transfer to lower the temperature rise of the power dissipation apparatus 100 from about 60 C.° to about 20 C.°. This reduction in the temperature rise would be even more significant for a power dissipation apparatus 100 with conductive traces 120 on both an upper and a lower surface due to the greater surface area of the conductive traces 120 from which the moving air could extract heat. In some embodiments the fan could utilize some of the power that would otherwise be directed into the power dissipation apparatus 100, thus reducing the resistive heating of the power dissipation apparatus 100. It should be appreciated that cooling devices other than or in addition to a fan, for example, a Peltier cooling module, could be utilized in some embodiments of the power dissipation apparatus 100.

Figure 2:
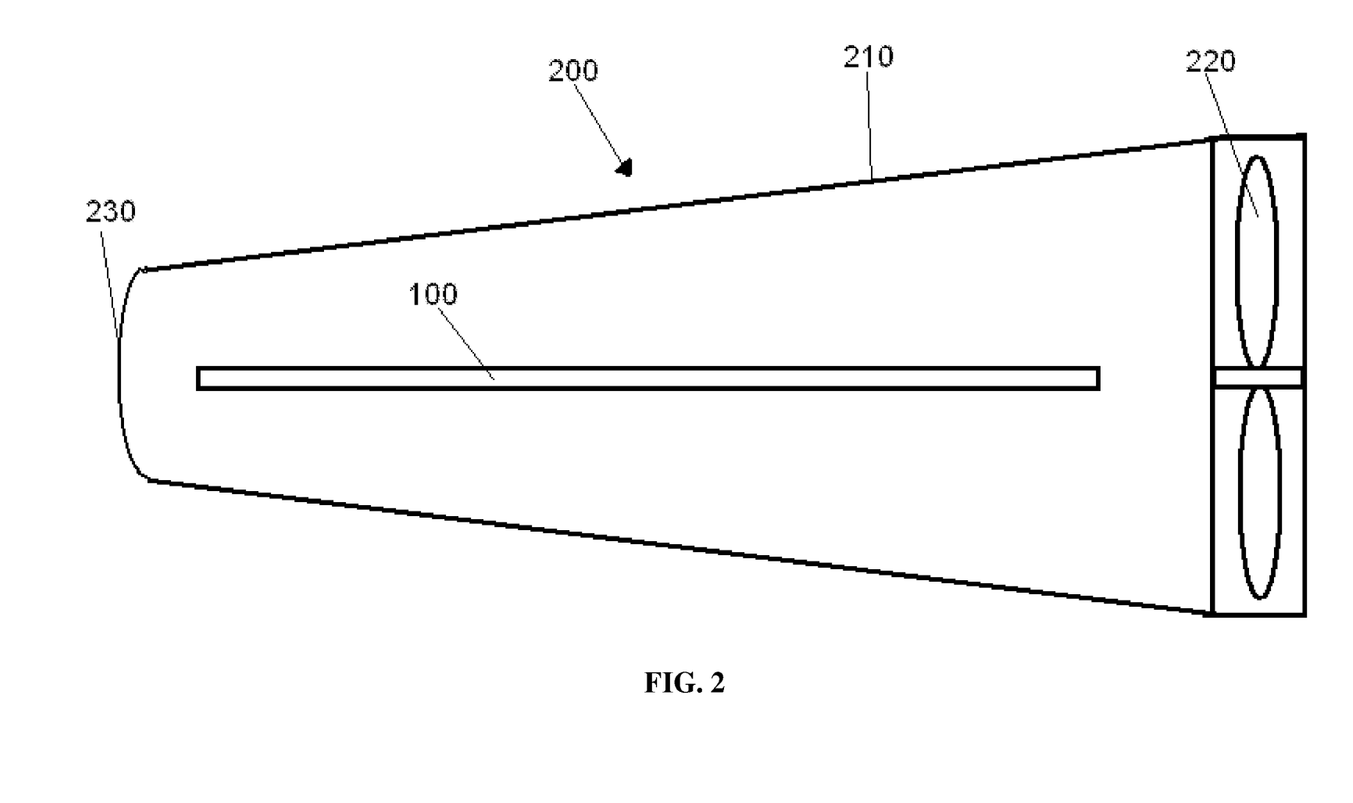
FIG. 2 is a cross-sectional view of an air flow conduit enclosing the power dissipation apparatus of FIG. 1.

In some embodiments, as illustrated in the cross-sectional diagram of FIG. 2, the power dissipation apparatus 100 can be mounted within a conduit 200. The conduit 200 may include walls 210 enclosing the power dissipation apparatus 100, and a fan 220 to force air through the conduit and out an open end 230 thereof. The walls 210 can be formed of plastic, metal, or any other suitable material capable of withstanding heat radiated from the power dissipation apparatus 100 while in operation. In some embodiments, the walls 210 of the conduit 200 can be air impermeable, and in other embodiments, the walls 210 can include openings such as holes or slots to provide for air flow into and out of the conduit 200 along its length. In different embodiments, the conduit can have a cross-sectional area perpendicular to the flow of air therethrough in the form of a circle (in which circumstance the conduit to could be described as a tube), an ellipse, a rectangle, or any other shape. In some embodiments, the conduit may have a substantially constant cross-sectional area along its length, and in other embodiments, the conduit may have a cross-sectional area that changes along its length. For example, the conduit 200 of FIG. 2 has a cross-sectional area that decreases from the side of the conduit in which the fan 220 is mounted to the open end 230. In some embodiments, the conduit 200 may be closed on one or both ends.

Where the conduit 200 has a decreasing cross-sectional area, as is shown in FIG. 2, the speed of air flowing through the conduit will increase as it flows from a portion of the conduit with a greater cross-sectional area to a portion with a lesser cross-sectional area. This increased speed of the air flowing along the length of the conduit facilitates a more even cooling of a power dissipation apparatus 100 mounted in the conduit. As air passes over a first portion of the power dissipation apparatus 100 it absorbs heat, making convective heat transfer from the power dissipation apparatus 100 to the air less effective for those portions of the power dissipation apparatus 100 the heated air next passes over. Increasing the speed of the air flow as the air is warmed at least partially compensates for this effect, thereby providing a more even cooling of the power dissipation apparatus than would occur if the air flowed over the entire power dissipation apparatus 100 at the same speed.

Figure 3:
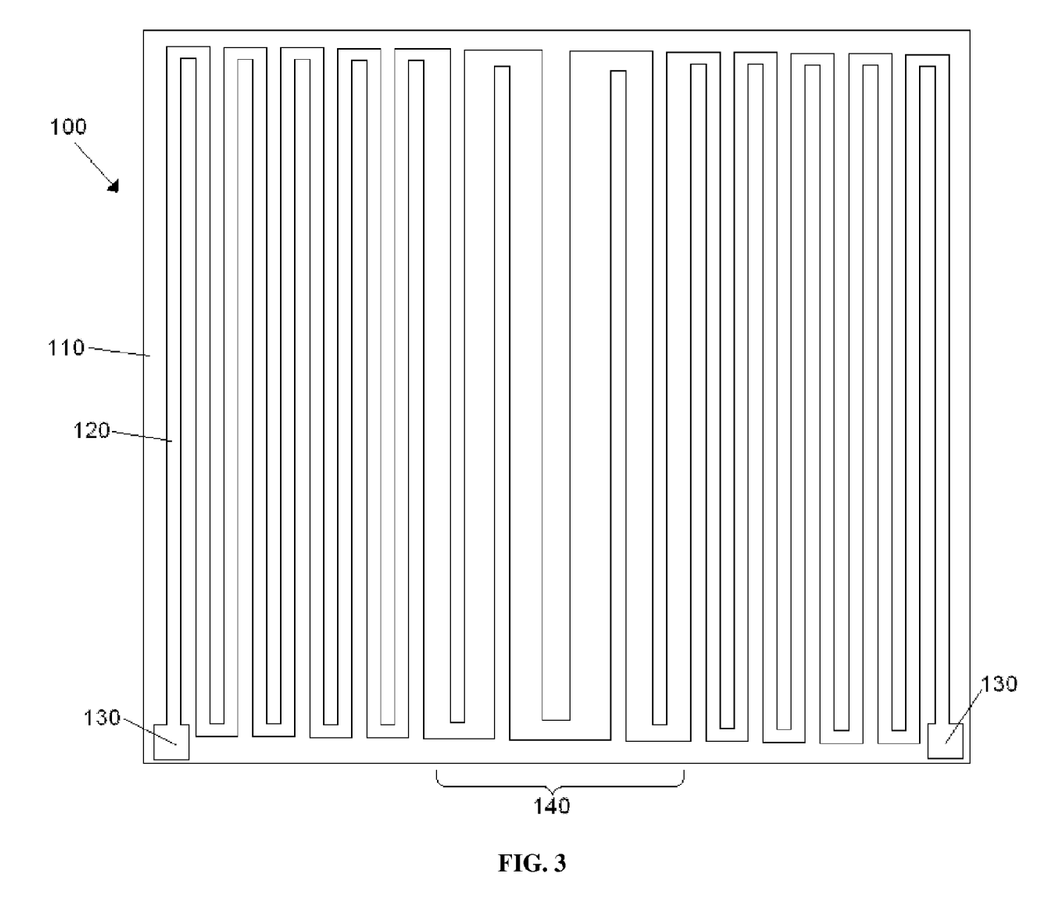
FIG. 3 is a plan view of a power dissipation apparatus according to another aspect of the present invention.

In some embodiments, sections of the conductive trace 120 near the center of the power dissipation apparatus 100 can heat up to a greater degree than sections of the conductive trace 120 near edges of the power dissipation apparatus 100 upon passage of electrical current through the conductive trace 120. This may be due to sections of the conductive trace 120 near the center of the power dissipation apparatus 100 being surrounded by more other sections of the conductive trace 120 than sections near the edge, or may be due to lesser air cooling of areas near the center of the power dissipation apparatus 100 than areas near the edges. In some embodiments, such as that illustrated in FIG. 3, to even out the temperature across the surface of the power dissipation apparatus 100, one or more sections 140 of the conductive trace 120 may be increased in width or thickness relative to other sections. Alternatively, or additionally, the spacing between conductive lines in different portions of the conductive trace 120 may be varied to facilitate the maintenance of a substantially even temperature profile across the surface of the power dissipation apparatus 100.

Figure 4:
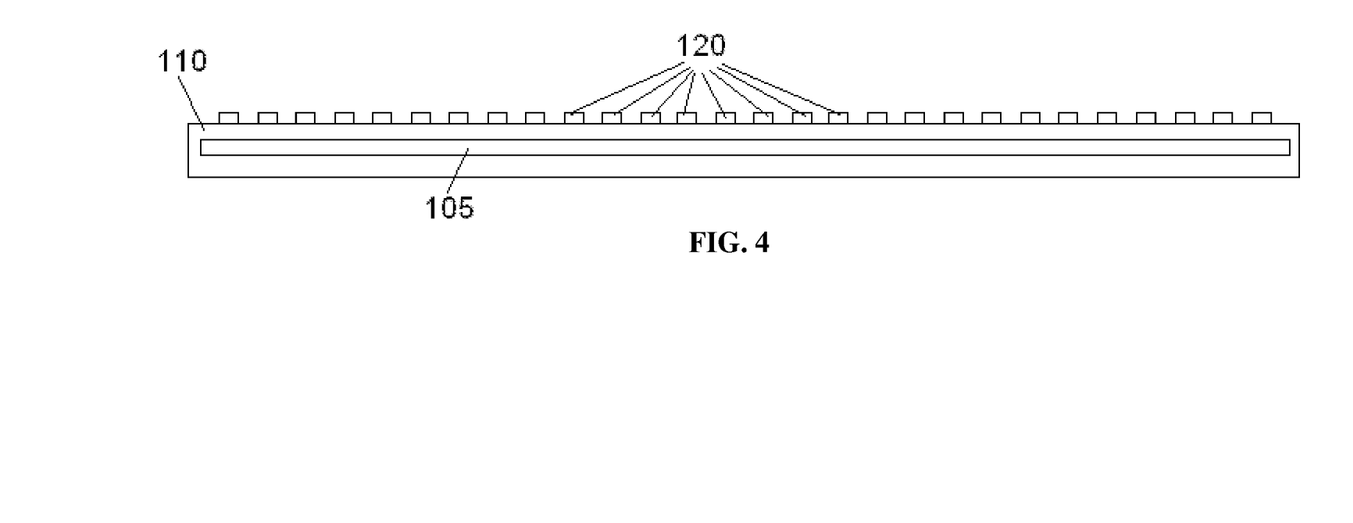
FIG. 4 is a cross-sectional view of the power dissipation apparatus of FIG. 1 along line 4-4 in FIG. 1.

In another embodiment, as illustrated in FIG. 4, which is a cross section of the power dissipation apparatus 100 along line 4-4 of FIG. 1, a thermally conductive layer 105, either buried within the substrate 110, present on a side of the substrate opposite that of the conductive trace 120, or present on a same side of the substrate as the conductive trace 120, but separated from the conductive trace by an electrically insulating layer, can facilitate transporting heat from hotter to cooler areas of the power dissipation apparatus 100. In some embodiments, both a variation in the dimensions or spacing of lines of the conductive trace and the utilization of a buried thermally conductive layer 105 can be used to facilitate the maintenance of a substantially even temperature profile across the surface of the power dissipation apparatus 100.

In some embodiments, the power dissipation apparatus 100 may be provided with a conductive trace 120 with a variable resistance. In some embodiments, the resistance of the conductive trace 120 may be regulated to provide a desired current through the conductive trace 120. In this manner, the power dissipation apparatus 100 can be used in a battery conditioner to not only dissipate heat produced from discharging a battery, but also to regulate the discharge current from the battery to a desired level.

Figure 5:
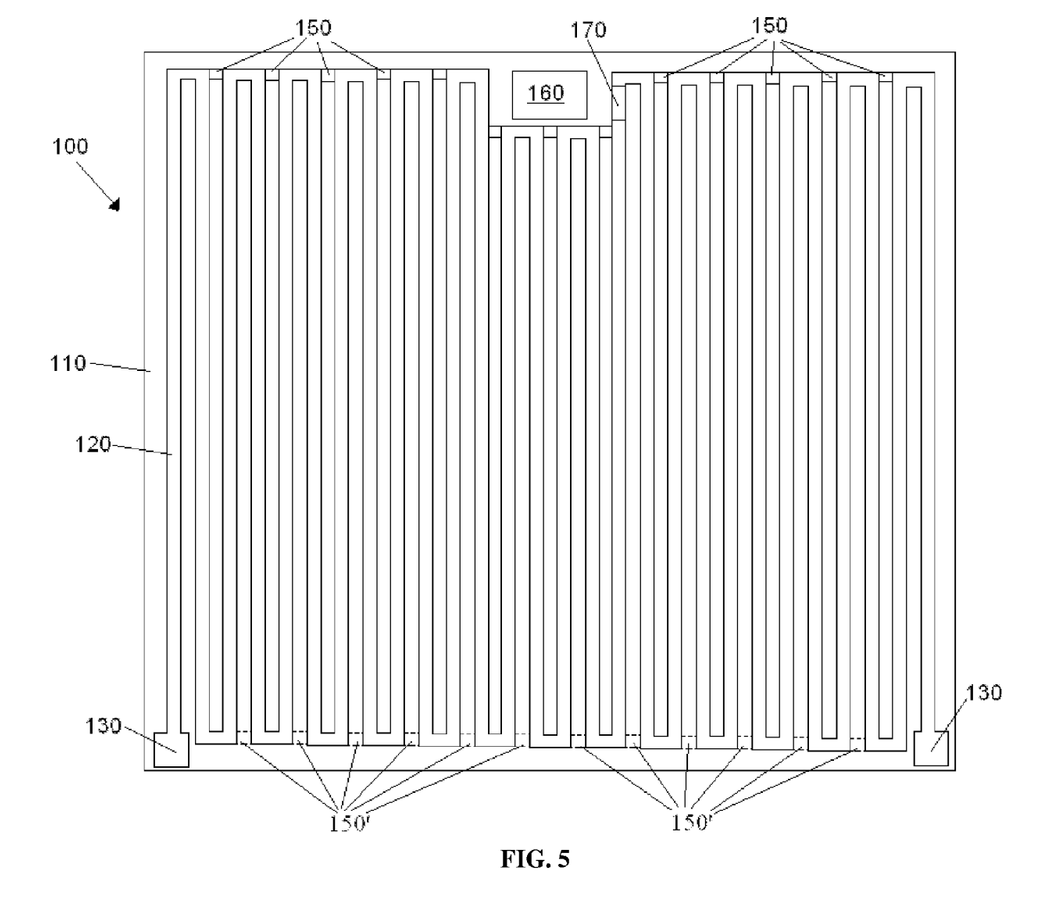
FIG. 5 is a plan view of a power dissipation apparatus according to another aspect of the present invention.

To provide a conductive trace 120 of a power dissipation apparatus 100 with a variable resistance, switches 150, such as field effect transistors (FETs) can be utilized to short out sections of the conductive trace 120 as desired. In some embodiments, one or more of the switches 150, may comprise a MOSFET, which may be operated as a two-state (i.e., on or off) digital switch, or may be operated in a linear (i.e., analog) mode, thereby providing the dissipating apparatus with a continuously variable effective resistance rather than only discrete values. In other embodiments, one or more of the switches 150 may comprise any device capable of providing a range of continuously-variable resistance. An embodiment of such a power dissipation apparatus 100 is illustrated in FIG. 5. As shown in FIG. 5, multiple switches 150 can be placed between different sections of the conductive trace 120. Closing one or more of the switches 150 would short out a section of the conductive trace, reducing its effective length. It should be noted that the embodiment illustrated in FIG. 5 is only one example. In other embodiments, more or fewer switches 150 may be present, and these switches may be used to short out longer or shorter portions of the conductive trace 120 than is illustrated in FIG. 5.

In other embodiments, one or more switches 150 may be arranged along the conductive trace 120 such that the operation of the one or more switches 150 may alter an electrical connection between one or more portions of the conductive trace from a serial configuration to a parallel configuration. For example, a second set of switches 150' shown in phantom in FIG. 5 may additionally be provided to permit sections of the conductive trace to be switched into various parallel and series combinations. This may enable all portions of the conductive trace to be utilized, even when a resistance for the conductive trace is desired that would be less than that exhibited by the conductive trace with all portions electrically connected in series. Running the heat dissipation apparatus with portions of the conductive trace electrically connected together in various serial and parallel configurations may allow for heat to be dissipated over a greater area of the conductive trace than could be attained when operating the heat dissipation apparatus with one or more sections of the conductive trace shorted out.

In one embodiment, the switches can be controlled by a microprocessor 160. In one embodiment, the microprocessor 160 can include a 12 bit internal analog to digital converter and a 4 bit output port. This microprocessor would be capable of controlling 16 switches 150 (or 16 combinations of switches 150) using a 4-16 line decoder. The microprocessor can read a voltage across a sense resistor 170, for example, a 25 milliohm resistor, to calculate the current through the conductive trace 120, and open or close various ones of switches 150 until a desired current through the conductive trace 120 is achieved. In some embodiments, current through the conductive trace may be measured by one or more alternative or additional techniques. For example, a Hall effect sensor could be used in addition to or as an alternative to the sense resistor 170 to measure a current through the conductive trace 120.

The microprocessor 160, sense resistor 170, and switches 150 can communicate via electrical conductors located on an opposite side of the substrate 110 from the conductive trace 120, or insulated from the conductive trace by an electrically insulating material, such as a polymer film. In some embodiments wherein the substrate comprises a multi-layer material, the microprocessor 160, sense resistor 170, and switches 150 can communicate via electrical conductors located between layers of the substrate. Additional heat dissipating conductive traces may also be present between layers of a multi-layer substrate. In accordance with some aspects of this embodiment, the power dissipation apparatus 100 of FIG. 5 is capable of maintaining a discharge current through the conductive trace 120 within about plus or minus three percent.

In other embodiments, the sense resistor 170 may comprise a thermistor, and the microprocessor 160 may control the switches 150 in response to a signal from the thermistor 170 to adjust the length (and resistance) of the conductive trace 120 to maintain a temperature of the power dissipation apparatus 100 within a desired range.

It should also be noted that many conductive materials exhibit an increase in resistivity as they are heated. For example, the electrical resistivity of copper increases by about 0.4% per degree Celsius. As such, in some embodiments, the conductive trace 120 may be formed of a material whose electrical resistance increases with temperature, and thus would become more resistive as more current is passed through it. The conductive trace 120 could thus self regulate the amount of current that passes through it. In some embodiments, the conductive trace 120 would self regulate the current passing through it to within plus or minus three percent and/or self regulate its temperature to within plus or minus five degrees Celsius of a desired level without external control.

Figure 6:
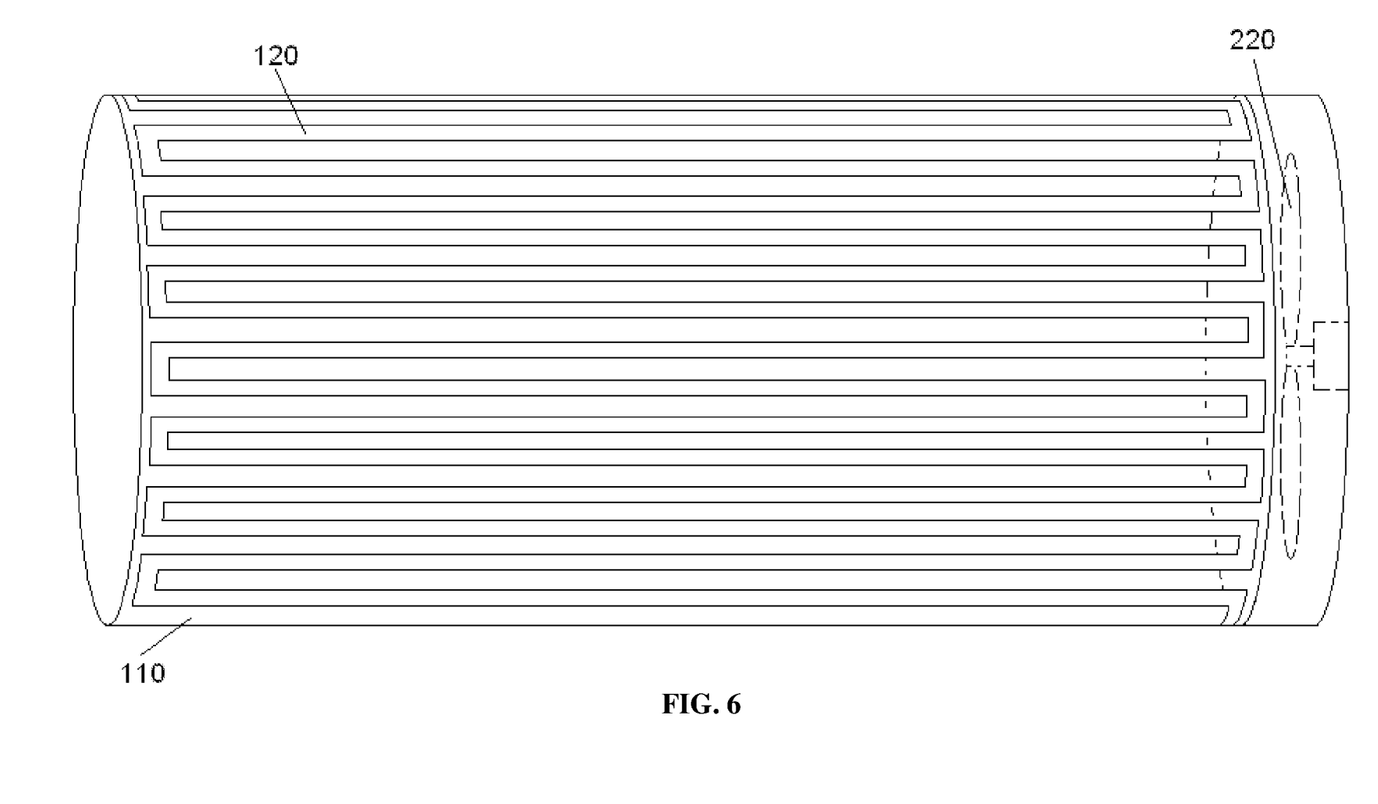
FIG. 6 is a plan view of a power dissipation apparatus according to another aspect of the present invention.

In another embodiment, illustrated in FIG. 6, the substrate 110 may be formed of a flexible material. A conductive trace 120 can be formed on one or both sides of the substrate, or in some embodiments, between two layers of flexible substrate material. In some embodiments, the flexible substrate material comprises an electrically insulating polymeric material. The first and second layers of flexible substrate material may be formed from the same polymeric material, or from different materials. One or both of the inner surfaces of the electrically insulating polymeric material may be coated with an adhesive, and the entire assembly vulcanized in a heated press, such as a heated vacuum press, to form an integrated assembly. It should be appreciated that other methods of manufacture may alternatively be used, as embodiments of the present disclosure are not limited to any particular process.

The substrate may be rolled into a tube or a conduit of another shape, and a fan 220 may be placed at one end of the conduit to direct air through the conduit and cool the conductive trace 120 when current is being passed therethrough. Forming a conduit from the rolled substrate to direct air along a surface of the conductive trace 120 (or along a film covering a surface of the conductive trace) eliminates the need for a separate structure to direct air over the substrate such as the conduit 200 of FIG. 2. Like the conduit of FIG. 2, the conduit formed of the flexible substrate may have a non-uniform cross section along its length, and like the power dissipation apparatus of FIG. 5, the flexible substrate may accommodate a microprocessor 160, switches 150, and a sense resistor 170 to provide for selectively shorting out portions of the conductive trace 120. In different embodiments, one or more elements of the circuitry including the microprocessor 160, switches 150, and sense resistor 170 may be disposed on the substrate 110 or on a separate circuit board.

In one embodiment, the flexible substrate may be formed from a foil resistance material surrounded by an electrically insulating material, such as Kapton® polyimide film, available from E.I. du Pont de Nemours and Company. Kapton®, a registered trademark of E.I. du Pont de Nemours and Company, is a polyimide film possessing excellent physical and electrical properties. It has superb chemical resistance; there are no known organic solvents for the film, it is certified to meet the requirements of MIL-P-46112 B and of ASTM D-5213-99, and it does not melt or burn. It has the highest UL-94 flammability rating: V-0. Kapton® polyimide film is rated for continuous operation from −269° C. (−452° F.) to 400° C. (752° F.), has a dielectric strength of approximately 7000 volts/mil at 25° C., has no significant thermal expansion or contraction properties, and has no known particle generating properties.

Although Kapton® and Kapton® MT, and Kapton® MTB are used in some embodiments as the electrically insulating material, other types of insulating materials, such as any other suitable polymer, rubber, plastic, or thermoplastic material may be used. Preferably, these electrically insulating materials are strong, have a high chemical resistance, do not melt or burn, possess minimal thermal expansion and contraction properties, and remain flexible over a wide temperature range. Further, it is preferred that the electrically insulating material have a relatively low thermal impedance, such that some of the heat generated by the conductive trace 120 is transferred through the electrically insulating material. It should be appreciated that not all of these properties may be required, such that other polymeric or insulating materials may be used. For example, in applications where exposure to reactive chemicals is unlikely, materials possessing lower chemical resistance may be used.

Figure 7:
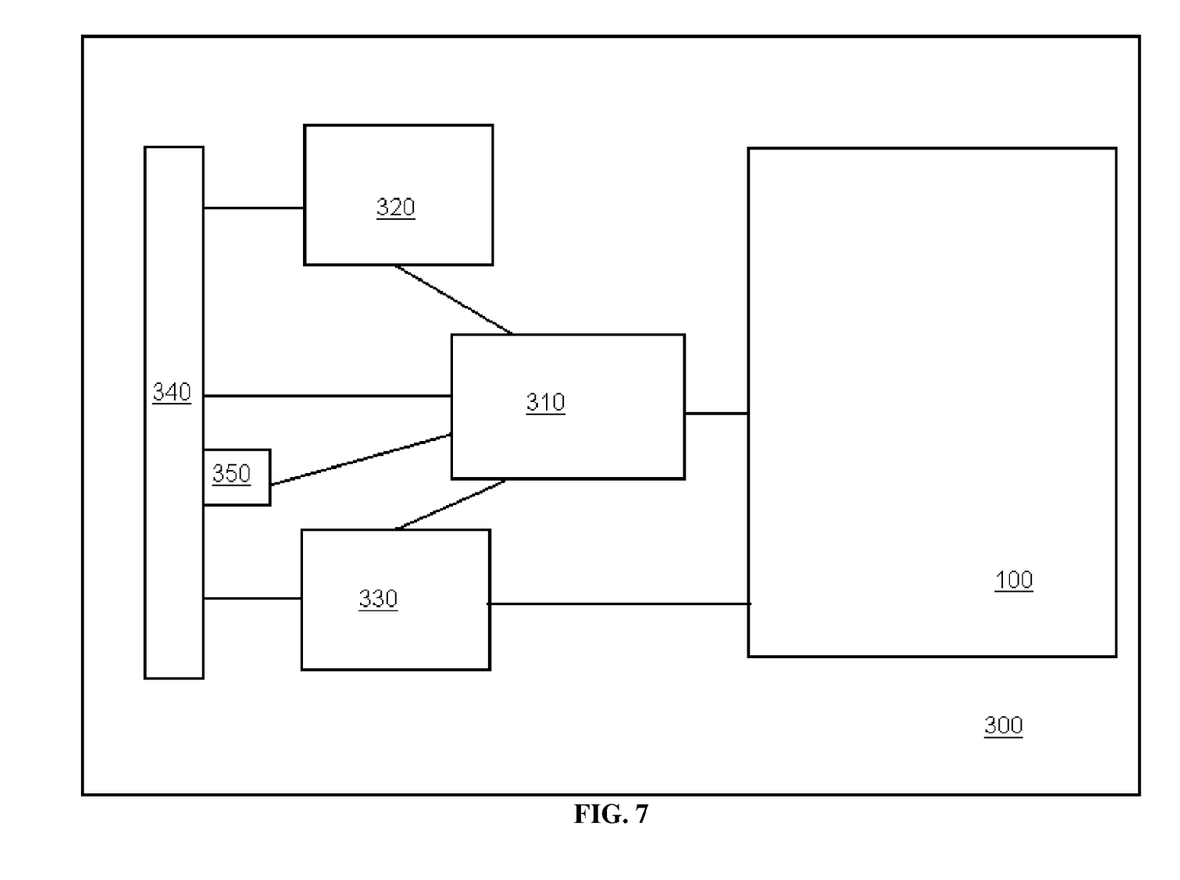
FIG. 7 is a block diagram of circuitry included in a battery conditioner in accordance with an aspect of the present invention.

The power dissipation apparatus 100 may be utilized in conjunction with a battery conditioner, which in some embodiments includes circuit elements such as those schematically illustrated in FIG. 7. The battery conditioner 300 may include a controller 310, comprising a microprocessor, ASIC, PLC controller, or any other electronic controller known in the art. The controller 310 is in electrical communication with both a battery charge circuit 320 and a battery discharge circuit 330. The charge and discharge circuits 320 and 330 are in electrical communication with a battery interface 340. The battery interface includes connections for delivering power to the battery from the charge circuit 320 and for delivering power from the battery to the discharge circuit 330. The battery interface 340 may also include a communications bus, such as an SM bus, for providing communications from a battery, such as a smart battery, connected to the battery interface 340 to the charge and/or discharge circuits 320, 330, or in some aspects directly to the controller 310. These communications may include, for example, an identification of the battery type or charge/discharge history of the battery, which may be utilized by the battery conditioner to determine an appropriate charge or discharge profile for the battery.

The controller 310 may also be in communication with a temperature sensor 350. Temperature sensor 350 is placed proximate a battery, and in some embodiments in contact with a battery, while the battery is present in a battery well in the battery conditioner to provide the controller 310 with an indication of the temperature of the battery. Monitoring the temperature of the battery may provide for to the controller 310 to abort a charge or discharge process if the battery becomes dangerously hot. In some embodiments, a smart battery connected to the charger may include its own temperature sensor, in which case the battery may communicate its temperature directly to one of the charge circuit 320, discharge circuit 330, or controller 310, rendering the temperature sensor 350 superfluous. In some embodiments, the temperature sensor 350 can be utilized to perform a check or a calibration on a temperature sensor included in a smart battery coupled to the battery conditioner.

The discharge circuit 330 may be connected to a resistive load, such as the power dissipation apparatus 100. Current drawn from the battery during discharge would be passed via the discharge circuit through the power dissipation apparatus 100. In some embodiments, the controller 310 can also be in electrical communication with the power dissipation apparatus, for example with a temperature sensor in the power dissipation apparatus, with the controller 160 of the power dissipation apparatus, with the sense resistor 170, or with one or more switches 150. This allows the controller 310 to control the operation of the one or more switches 150 to adjust the resistance of the power dissipation apparatus circuit path, to monitor the current or voltage applied to the power dissipation apparatus, or to monitor the temperature of the power dissipation apparatus and instruct the discharge circuit 330 to alter the power applied to the power dissipation apparatus as needed, such as where the power dissipation apparatus is exceeding a desired temperature.

In different aspects, one or more of the circuit elements 310, 320, and 330 can be formed on the same circuit board, or on different circuit boards, or as parts of the same or different integrated circuits. In some aspects the power dissipation apparatus 100 can reside within the body of a battery conditioner 300 or other device, for example, mounted to an internal surface of a wall of the battery conditioner 300 or other device. A fan (not shown) may also be present within the body of the power dissipation apparatus to direct air across the power dissipation apparatus to remove heat therefrom. Vents can be provided in the body of the battery conditioner to permit cool air to enter and to allow warm air to exit the interior of the body of the battery conditioner. In some aspects the power dissipation apparatus 100 may be formed on a same circuit board as any one or more of the circuit elements 310, 320, 330, 340, or 350.

Figure 8:
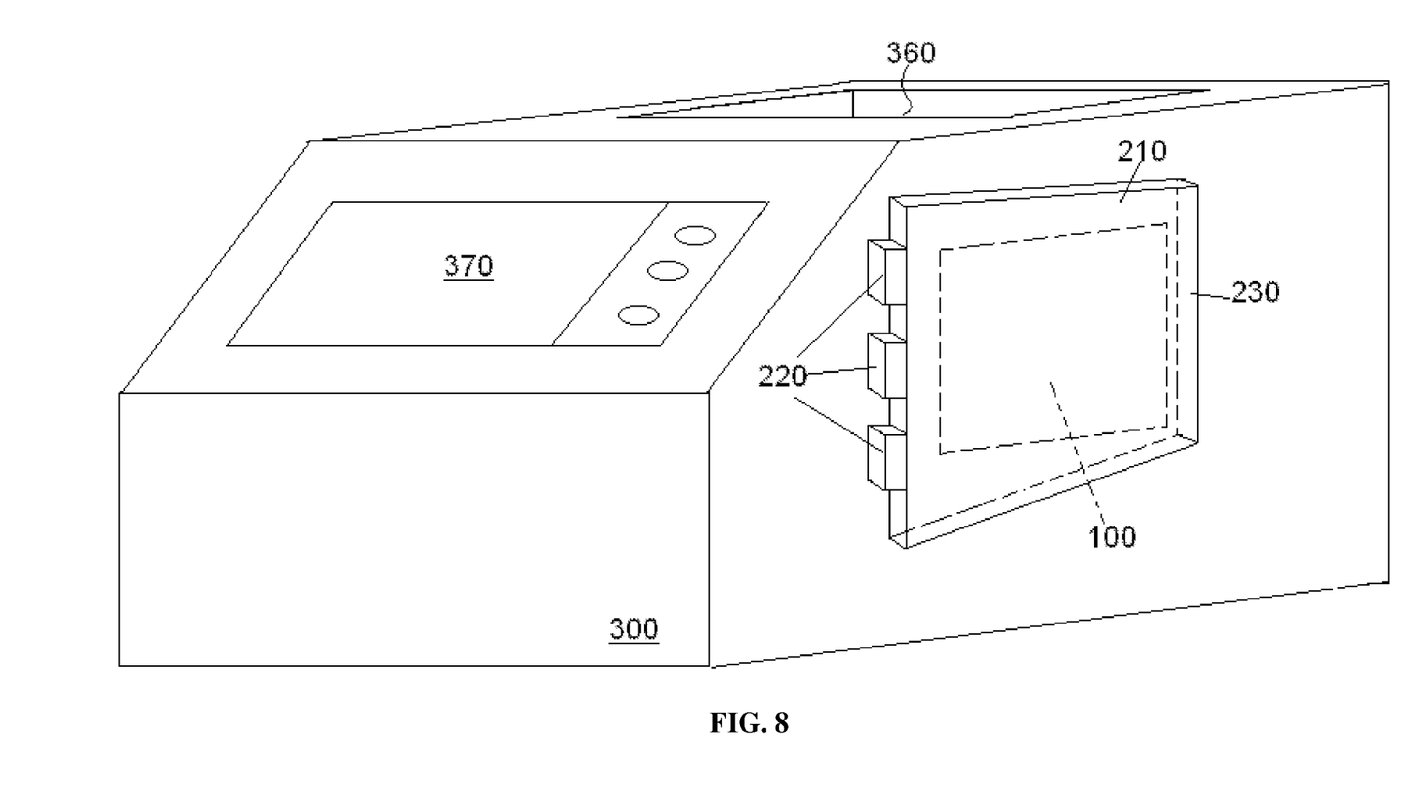
FIG. 8 is an isometric view of a battery conditioner with a power dissipation apparatus according to another aspect of the present invention mounted to an external surface of a side wall thereof.

In a further embodiment, the power dissipation apparatus 100 may be mounted to an external surface of a piece of equipment, such as to an external side of a wall of a battery conditioner. This is illustrated in FIG. 8, where a power dissipation apparatus 100 is mounted to an external side of a side wall of a battery conditioner 300. Also illustrated in FIG. 8 is a battery bay 360 formed in the upper surface of the battery conditioner into which batteries to be conditioned can be placed, as well as a display/control panel 370 which may be used as a user interface for the battery conditioner 300.

Various structures may be used to mount the power dissipation apparatus 100 to the wall of the battery conditioner. For example, thermally conductive adhesives or adhesive tapes, such as Thermally Conductive Adhesive Transfer Tapes 8805, 8810, 8815, 8820, available from 3M Corporation, may be used to mount the power dissipation apparatus 100 to a wall of the battery conditioner.

Mounting the power dissipation apparatus 100 to the side wall of a battery conditioner 300 provides for the external surface of the battery conditioner 30 to serve as a heat sink from which heat may be withdrawn from the power dissipation apparatus by thermal conduction. In additional embodiments, the power dissipation apparatus 100 mounted to the side wall of a battery conditioner 300 may be at least partially enclosed by walls 210 forming a conduit, such as conduit 200 of FIG. 2. This conduit may have one or more fan units 220 to provide a flow of air through the conduit and out an open end 230 thereof.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A battery conditioner comprising:
   circuitry configured to withdraw current from a battery and direct the current into a power dissipation apparatus comprising:
   a non-conductive substrate; and
   a conductive trace formed at least one of in the substrate and on the substrate, the conductive trace having a first end coupled to the battery and a second end;
   wherein the conductive trace converts substantially all of the current from the battery into heat between the first end and the second end.

2. The battery conditioner of claim 1, wherein the non-conductive substrate is formed into the shape of an open ended conduit.

3. The battery conditioner of claim 2, further comprising a fan configured to direct air through the open ended conduit formed from the non-conductive substrate.

4. The battery conditioner of claim 3, wherein the electrical resistance of the conductive trace between the first end and the second end conductive trace is variable.

5. The battery conditioner of claim 4, wherein the power dissipation apparatus further comprises at least one switch, electrically connected between a first region of the conductive trace and a second region of the conductive trace and configured to create a short circuit between the first region of the conductive trace and the second region of the conductive trace.

6. The battery conditioner of claim 5, further comprising a sense resistor, wherein the switch comprises a transistor configured to short out a section of the conductive trace that interconnects the first region and the second region responsive to a signal from the sense resistor indicative of a current through the conductive trace being outside of a defined range.

7. The battery conditioner of claim 6, wherein the conductive trace has a resistance of between about 1 ohm and about 100 ohms.

8. The battery conditioner of claim 6, wherein the conductive trace has a resistance of between about 2 ohms and about 40 ohms.

9. The battery conditioner of claim 4, wherein the conductive trace is dimensioned to self-limit a temperature of the conductive trace to within ±5° Celsius of a defined temperature when a defined voltage is applied across the first end and the second end of the conductive trace.

10. The battery conditioner of claim 1, wherein the conductive trace is surrounded by an electrically insulating material.

11. The battery conditioner of claim 1, wherein the conductive trace has a non-uniform cross-sectional area along a length thereof.

12. The battery conditioner of claim 11, wherein the conductive trace comprises a plurality of substantially parallel interconnected lines of conductive material each having a width and including a first subset of substantially parallel interconnected lines of conductive material and a second subset of substantially parallel interconnected lines of conductive material, the width of each of the substantially parallel interconnected lines of conductive material in the first subset being greater than the width of each of the substantially parallel interconnected lines of conductive material in the second subset.

13. The battery conditioner of claim 1, wherein the power dissipation apparatus is mounted to an external surface of the battery conditioner and is in thermal communication with the external surface of the battery conditioner.

14. The battery conditioner of claim 1, wherein the conductive trace comprises a plurality of substantially parallel interconnected lines of conductive material including a first subset of substantially parallel interconnected lines of conductive material and a second subset of substantially parallel interconnected lines of conductive material, a spacing between adjacent substantially parallel interconnected lines of conductive material in the first subset being greater than a spacing between adjacent substantially parallel interconnected lines of conductive material in the second subset.

15. The battery conditioner of claim 1, further comprising a fan and an open ended conduit, wherein the non-conductive substrate is enclosed in the open ended conduit and the fan is configured to direct air through the open ended conduit.

16. The battery conditioner of claim 15, wherein the open ended conduit has a non-uniform cross-sectional area along a length thereof.

17. The battery conditioner of claim 15, wherein the open ended conduit includes one or more openings in a wall thereof, the one or more openings configured to provide for air flow into and out of the open ended conduit along a length thereof.

18. The battery conditioner of claim 15, wherein the non-conductive substrate is formed from epoxy impregnated fiberglass.

19. The battery conditioner of claim 1, further comprising a thermally conductive material enclosed within the substrate.

20. The battery conditioner of claim 1, wherein the conductive trace comprises a first conductive trace formed on a first side of the substrate, the power dissipation apparatus further comprising a second conductive trace formed on a second side of the substrate and electrically connected to the first conductive trace.

21. A method of conditioning a battery, the method comprising:
    withdrawing current from the battery;
    directing the current through a power dissipation apparatus comprising:
        a non-conductive substrate; and
        a conductive trace formed at least one of in the substrate and on the substrate; and
    converting substantially all of the current into heat along a length of the conductive trace.

22. The method of claim 21, further comprising adjusting an electrical resistance of the conductive trace.

23. The method of claim 22, further comprising maintaining a current through the conductive trace within a defined tolerance band.

24. The method of claim 23, wherein maintaining the current through the conductive trace within the defined tolerance band comprises shorting out a section of the conductive trace responsive to a signal from a sense resistor indicative of a current through the conductive trace being outside of the defined tolerance band.

25. The method of claim 22, further comprising maintaining a temperature of the power dissipation apparatus within a defined tolerance band.

26. The method of claim 25, wherein maintaining the temperature of the power dissipation apparatus within the defined tolerance band comprises shorting out a section of the conductive trace responsive to a temperature of the power dissipation apparatus being outside of the defined tolerance band.

27. The method of claim 21, further comprising dissipating the heat.

28. The method of claim 27, wherein dissipating the heat comprises conducting heat into an external surface of a battery conditioner.

29. The method of claim 27 wherein dissipating the heat comprises directing air across the conductive trace.

* * * * *

UNITED STATES PATENT AND TRADEMARK OFFICE
CERTIFICATE OF CORRECTION

| | | |
|---|---|---|
| PATENT NO. | : 8,970,171 B2 | Page 1 of 1 |
| APPLICATION NO. | : 12/984951 | |
| DATED | : March 3, 2015 | |
| INVENTOR(S) | : Michael Lopin et al. | |

It is certified that error appears in the above-identified patent and that said Letters Patent is hereby corrected as shown below:

In the Specification:

Column 1, Line 53, delete "to to" and insert -- to --.

Column 2, Line 28, delete "ended to" and insert -- ended --.

Column 4, Line 55, delete "to".

Column 5, Line 31, delete "to to" and insert -- to --.

Column 6, Line 46, delete "to".

Column 10, Line 34, delete "to".

Signed and Sealed this
Eleventh Day of August, 2015

Michelle K. Lee
*Director of the United States Patent and Trademark Office*